United States Patent [19]
Butler et al.

[11] Patent Number: 5,490,114
[45] Date of Patent: Feb. 6, 1996

[54] HIGH PERFORMANCE EXTENDED DATA OUT

[75] Inventors: Edward Butler, Richmond; Robert B. Goodwin, Colchester; Hemen R. Shah, Essex, Jct; Robert Tamlyn, Jerico, all of Vt.

[73] Assignee: International Business Machines Corporation, Armonk, N.Y.

[21] Appl. No.: 362,086

[22] Filed: Dec. 22, 1994

[51] Int. Cl.$^6$ .................................................. G11C 7/00
[52] U.S. Cl. ............... 365/189.05; 365/191; 365/189.07; 365/230.08
[58] Field of Search ............................. 365/189.05, 191, 365/230.08, 230.06, 189.07, 189.01, 233.5, 196

[56] References Cited

U.S. PATENT DOCUMENTS

| | | | |
|---|---|---|---|
| 4,573,147 | 2/1986 | Aoyama et al. | 365/230 |
| 4,763,305 | 8/1988 | Kuo | 365/200 |
| 4,811,294 | 3/1989 | Kobayashi et al. | 365/189 |
| 4,827,454 | 5/1989 | Okazaki | 365/233 |
| 4,849,935 | 7/1989 | Miyazawa | 365/189 |
| 5,005,156 | 4/1991 | Takai | 365/189 |
| 5,051,955 | 9/1991 | Kobayashi | 365/189 |
| 5,200,926 | 4/1993 | Iwahashi et al. | 365/233 |
| 5,272,670 | 12/1993 | Hashimoto | 365/195 |
| 5,287,326 | 2/1994 | Hirata | 365/230 |
| 5,289,430 | 2/1994 | Tran | 365/230 |
| 5,325,330 | 6/1994 | Morgan | 365/189 |
| 5,343,428 | 8/1994 | Pilo et al. | 365/189 |
| 5,349,566 | 9/1994 | Merritt et al. | 365/233 |
| 5,384,504 | 1/1995 | Dickinson et al. | 365/189.05 |

*Primary Examiner*—David C. Nelms
*Assistant Examiner*—F. Niranjan
*Attorney, Agent, or Firm*—Eugene I. Shkurko

[57] ABSTRACT

A high performance latch for read and write operations in RAM having a Complimentary Interlock circuit that eliminates the need for external timing to the RAM which might limit its high performance operation. For both read and write operations, the complementary interlock circuit extends a latching signal until valid data appears on the read or write data lines, thus preventing a valid data miss.

9 Claims, 7 Drawing Sheets

HIGH PERFORMANCE EXTENDED DATA OUT

FIELD OF THE INVENTION

This invention relates to Random Access Memory (RAM) devices and more particularly to I/O performance and timing of semiconductor memories such as Dynamic Random Access Memory (DRAM) requiring the latching, at a prescribed time, of data signals that are generated independently or appear asynchronously with respect to the latching signal.

BACKGROUND OF THE INVENTION

Computer systems, e.g. Personal Computers, Workstations, Graphic Display Systems, Game Units, and a variety of other apparatuses, widely use memory components made up of, for example, DRAMs. These memory components store digital representations of information (data bits—0's and 1's) which are used by the Central Processing Unit (CPU) for processing. The rate at which the data can be stored to (written) and retrieved from (read) the DRAM accurately, i.e., access time or cycle time, is a critical parameter in computer system performance.

Most DRAMs store digital information in an array of cells, one bit per cell using a capacitor and a transistor, which are typically arranged in a two dimensional fashion, i.e. rows and columns. Rows are referred to as wordlines and columns as bitlines. A cell can be uniquely addressed by selecting its associated wordline and bitline. A DRAM supports both a read and write operation to each cell (other operations, of course, are supported but are not relevant to this invention). Both operations require a row address presented on the address input pins during a Row Address Strobe (RAS), and a column address presented on the address pins during a Column Address Strobe (CAS), thus, the memory cell is addressed for memory operations. The state of the Write Enable (WE) pin is evaluated to determine if a read or a write operation is to be performed. For a read operation, the row address is decoded by the row decoder to determine the targeted wordline and the column address is decoded by the column decoder. The selected wordline data is presented on the bitline identified by the column decoder and is connected to a primary sense amplifier that amplifies the cell data (small capacitor charge), then the bitline data is presented to a data line, which transfers the bitline data to a secondary sense amplifier, which again amplifies the data, and whose output is latched in a hold latch. This data is then processed from the hold latch to the Off Chip Driver (OCD), which presents the data to the output pins of the DRAM for processing by the computer system or by other devices.

A write operation, i.e. , WE pin enabled, parallels the read operation just described up through the step of decoding the bitline address at the CAS, which selects the memory cell. Following this, new data, stored at the data-in latch, is transferred to the write drivers which then transfer the new data to the data lines, over-write the sense amplifiers, and store the new data into the addressed cells.

There are several modes of operation such as Fast Page Mode, Pipeline Page Mode, and Extended Data Out, which are well known in the art and are not particularly relevant to the present invention. Briefly, traditional Page Mode uses the CAS leading edge to perform a memory cell access and the trailing edge to restore the access path. Extended Data Out is distinguished by data continuing to be valid after the trailing edge of CAS goes inactive and remains valid until the next leading edge of CAS. Usually, the CAS trailing edge latches the data into the hold latch, thereby allowing data to remain valid throughout the CAS restore phase.

One can improve performance of Extended Data Out by decreasing the cycle time of CAS and optimizing the associated circuitry. This approach is acceptable until the CAS (which is generated external to the memory array) cycle time becomes shorter than the time required to access data internal to the DRAM, i.e., the time for the cell potential to appear on the data line. Under this condition invalid data is processed during a read cycle since newly addressed data cannot be retrieved in time before the next CAS. Similarly, new data fails to be written accurately into the DRAM during a write cycle if the CAS active phase is too short.

SUMMARY OF THE INVENTION

The present invention improves upon a memory system having a two dimensional array of addressable memory cells, for example, a typical DRAM device. Typically included is control logic for providing a row address in a RAS and a column address during a CAS cycle, a decoder for said addresses, used to address a memory cell which holds a data bit, logic for processing the memory cell data bit by latching the memory cell data in a hold latch for post data processing use, and data drivers and data signal lines to present data externally to the DRAM. The DRAM's dependence on an externally generated signal to control the events of an independent internal process restricts the performance of a read or write operation because of timing mismatch between these two independent processes. The present invention teaches a means of circumventing the above restriction by providing the exact interlock signal required by the internal process, which is generated utilizing the complementary signals naturally present in the DRAM data path circuitry, thus allowing improved performance by extending the latching signal until valid data is retrieved from the memory cell, or valid data is ready to be written into the memory cell.

Thus, it is an object of this invention to provide a more reliable means for storing and retrieving valid data in a semiconductor memory.

Another object of this invention is to improve the timing of I/O operations in a semiconductor memory device as between asynchronous signals used to process I/O operations.

Yet another object of the present invention is to guarantee the latching of valid data to be stored or retrieved from a semiconductor memory device.

Other features and advantages of this invention will become apparent from the following detailed description of the presently preferred embodiment of the invention, taken in conjunction with the accompanying drawings.

BEST MODE FOR CARRYING OUT THE INVENTION

Overview

Figure 1:
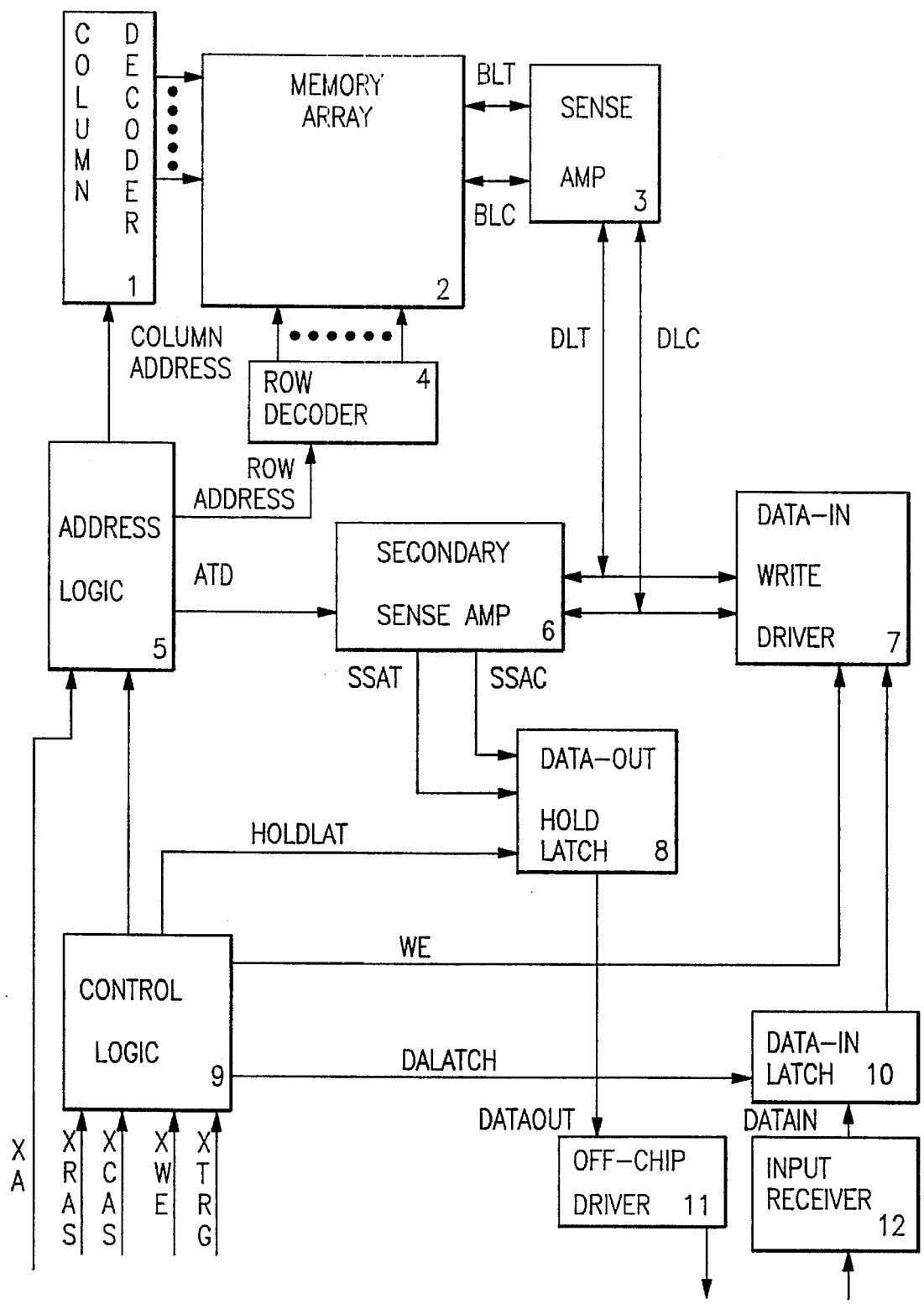
FIG. 1 is a representation of the prior art configuration of internal read/write DRAM processes.
Figure 2:
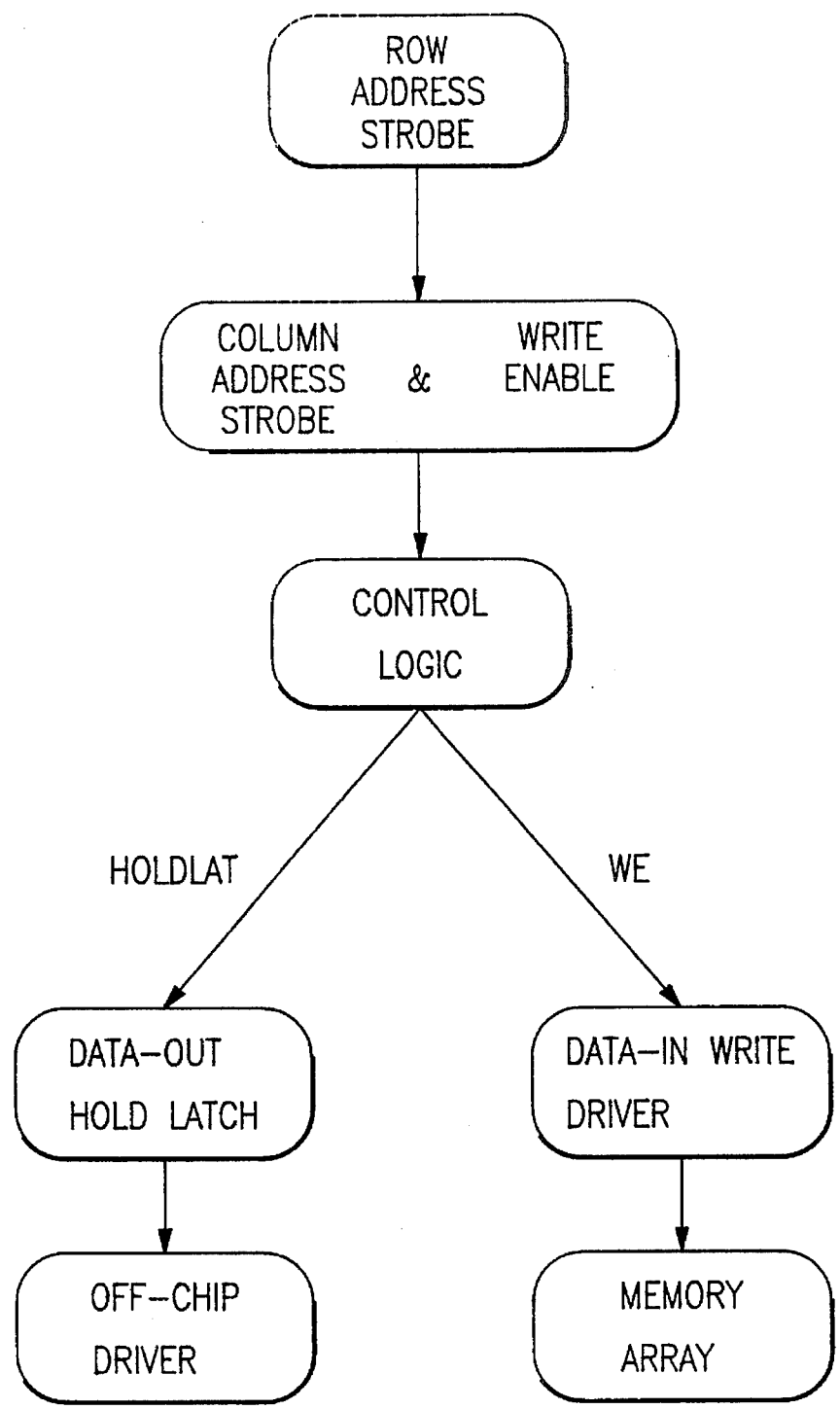
FIG. 2 is a functional flow chart illustrating the prior art read/write function.

The basic known DRAM read/write architecture relevant to the operation of the present invention is depicted in FIG. 1 where lines and arrows indicate physical data lines coupling hardware performing the functions as labelled. FIG. 2 shows a functional flow chart of the read and write operations and can also be referred to for the following discussion.

The Address Logic 5 receives the RAS and CAS addresses on signal lines from the coupled Control Logic 9, and then implements the decode for these addresses via the coupled Row Decoder 4 and Column Decoder 1, respectively. A wordline and bitline are generated from the decoders and a unique memory cell is addressed in memory array 2 for receiving data to be stored or for providing data to be retrieved. Control Logic 9 determines the logic state, i.e. , read or write, from the write enable signal, XWE, and interprets the state of the coupled input pins XRAS, XCAS, and XTRG, which carry signals generated externally to the DRAM, such as from a CPU, for example. For example, a high performance data-out operation (READ) processes data based on the leading edge of a Column Address Strobe (CAS). The leading edge of the CAS typically latches valid data into a hold latch for a read cycle.

For a write operation, valid data is presented at the Input Receiver 12, also from a CPU, for example, and latched in the Data-In Latch 10. The Data-In Write Driver 7 is enabled via the write enable WE signal from Control Logic 9, the Sense Amp 3 (Sense Amplifier) latch is set and valid data is written to the Memory Array 2, i.e. memory cell, completing the write operation. The trailing CAS edge terminates the write operation.

For a read operation, the presented RAS and CAS addresses are decoded, as described above for the write operation, a memory cell is uniquely addressed, and the Sense Amp 3 is set with the selected cell data from the coupled memory array 2. Data is then processed through a second Sense Amp 6 (Secondary Sense Amplifier), held in a Data-Out Hold Latch 8, and presented externally from the DRAM via the Off-Chip Driver 11.

Figure 3:
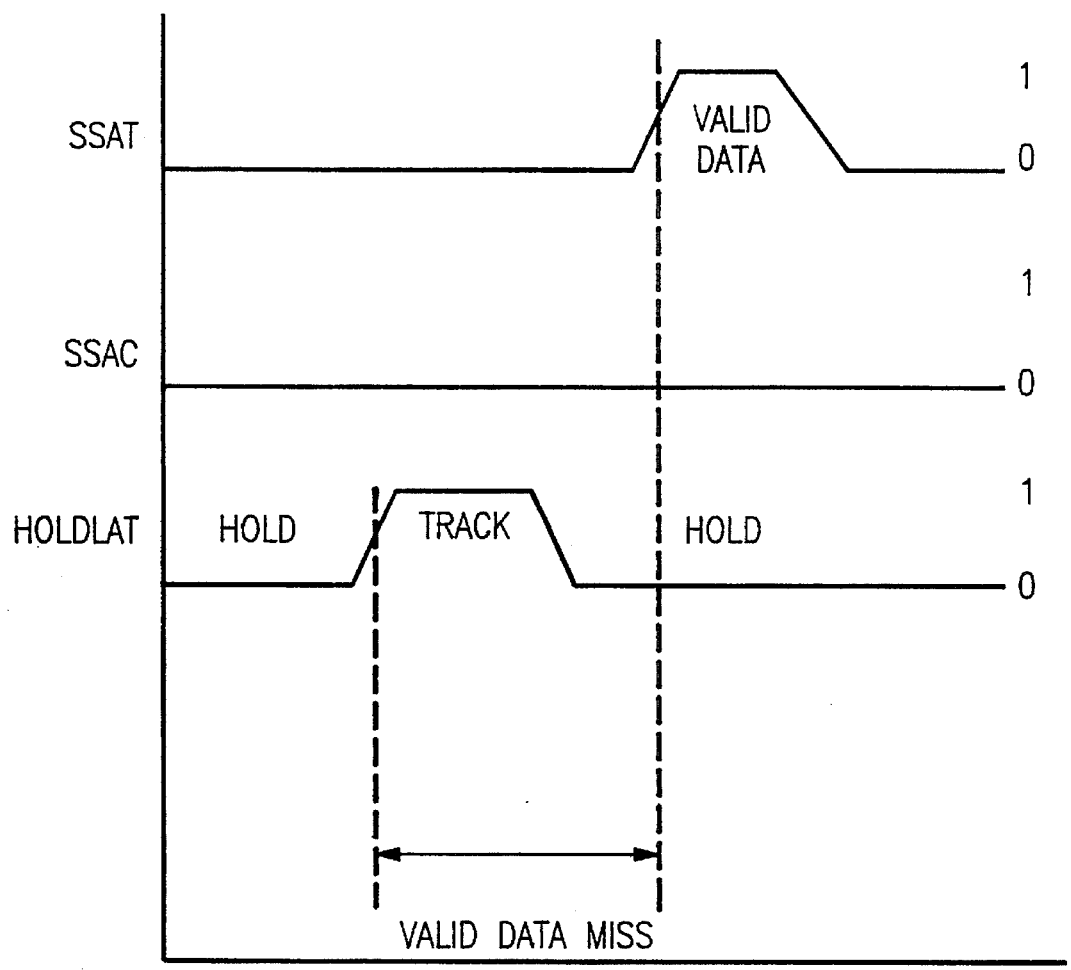
FIG. 3 is a signal waveform diagram illustrating the prior art read operation, showing valid data and the Hold Latch strobe in a timing mismatch.

FIG. 3 shows the waveforms for this approach for latching valid data in the Data-Out Hold Latch 8, FIG. 1, during a read state under high performance conditions. Signals Secondary Sense Amplifier True (SSAT) and Secondary Sense Amplifier Complement (SSAC) are complementary valid data out, signal HOLDLAT (Hold Latch) is the CAS generated latching signal. Since there is a timing independence between the signals HOLDLAT and SSAT, these signals are prone to timing mismatch (asynchronicity) by the time they appear at Data-Out hold latch 8. One cause for this timing mismatch is the difference in propagation delay of the signals from Control Logic 9 to the Data-Out Hold Latch. Invalid data can thus be latched due to the timing mismatch as shown in FIG. 3.

Complementary Interlocks

Figure 4:
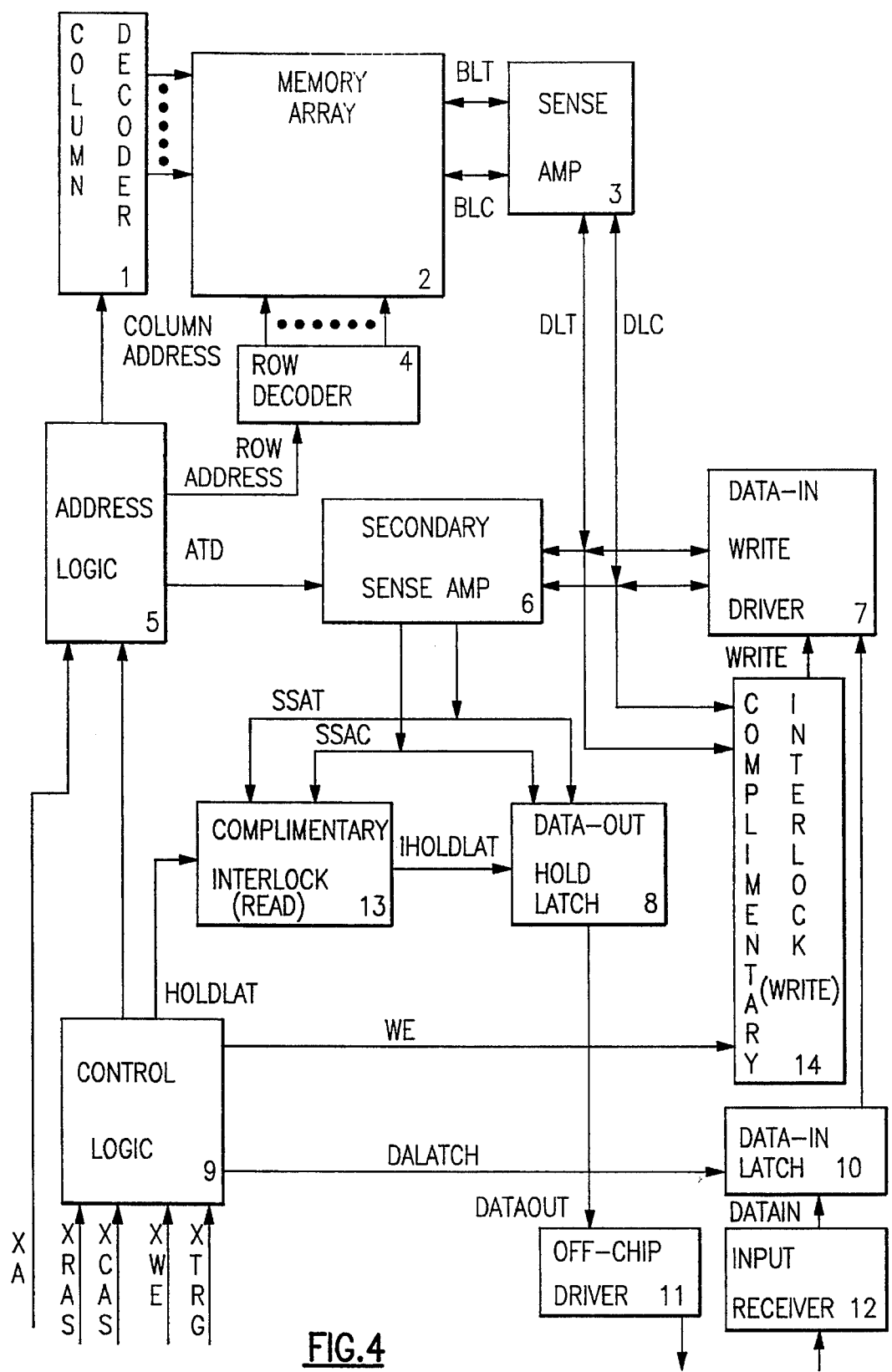
FIG. 4 is a representation of the present invention configuration of internal read/write DRAM processes.

One embodiment of a DRAM in accordance with the present invention is presented in FIG. 4, which is a modification of FIG. 1 only by the inclusion of the Complementary Interlocks, 13 and 14, for a read and a write operation, respectively, and the data paths associated with these interlock circuits. The memory system includes a dynamic random Memory Array 2 consisting of memory cells in a row/column fashion, as explained previously, and each of which are uniquely addressable by decoding a RAS and CAS resulting in a data read or write over the bit lines Bit Line True (BLT) and Bit Line Complement (BLC); a Sense Amp(s) 3 to amplify the minute read data potential to a usable voltage level of the semiconductor device and sending (or receiving) the read data (or the write data) over complementary data lines Data Line True (DLT) and Data Line Complement (DLC) to Secondary Sense Amp 6; a Row Decoder 4 and Column Decoder 1 to decode the externally generated RAS and CAS provided to Address Logic 5; an input Control Logic block 9 to deduce a Read or Write state; a Second Sense Amp 6 to amplify Read data to a logic level (0 or 1) of the semiconductor device; a Data-Out Hold Latch 8 to retain Read data; a Complementary Interlock (Read) 13 used to control when to latch read data; an Off-Chip Driver 11 to drive data off the DRAM to another device, for example; an Input Receiver 12 to translate Write data for input to the DRAM; a Data-In Latch 10 to hold said data; and a Complementary Interlock (Write) 14 used to control the Data-In Write Driver turn-off 7 (which includes a data-in buffer) to the Memory Array 2.

Figure 5:
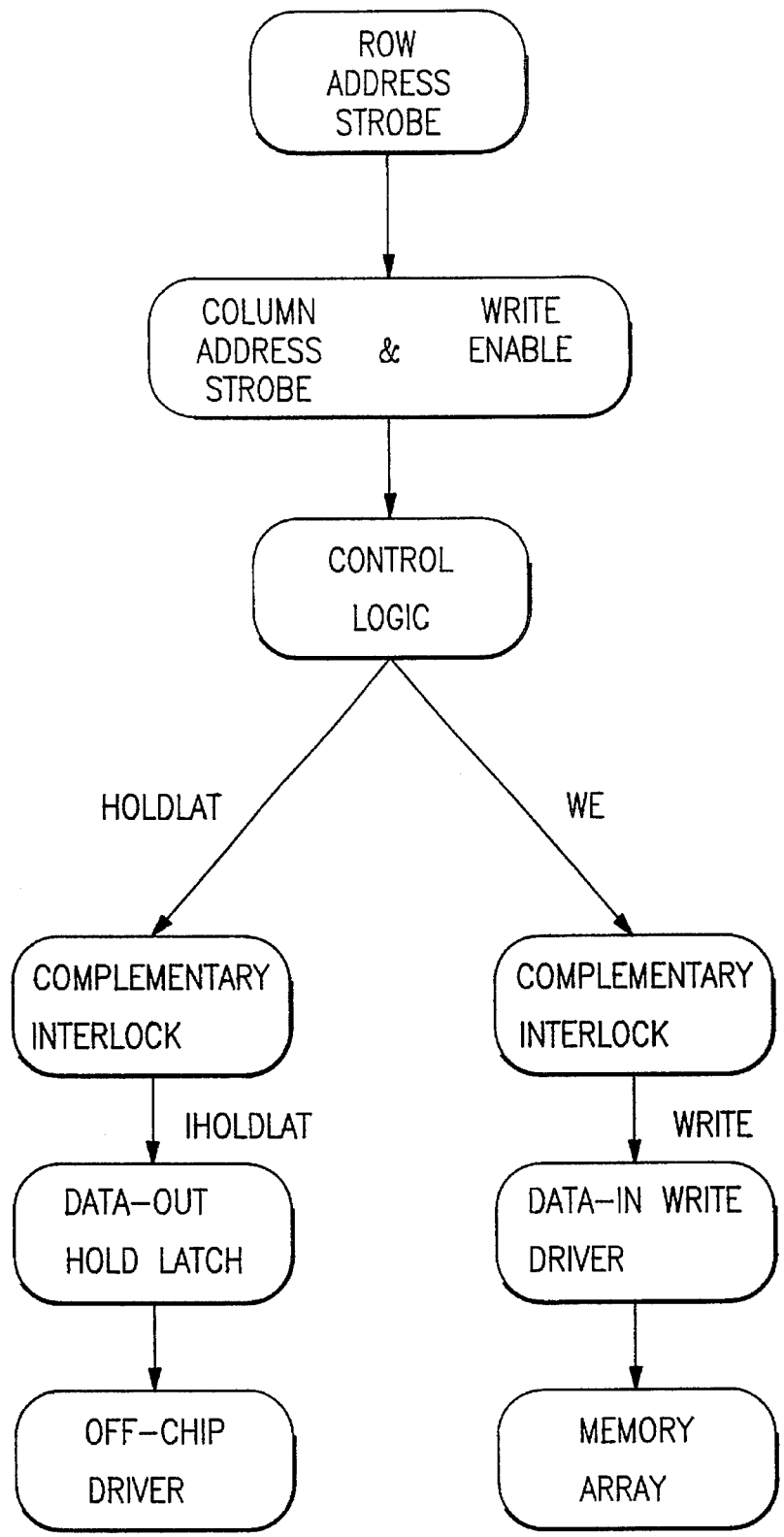
FIG. 5 is a functional flow chart illustrating the present invention read/write function.
Figure 6:
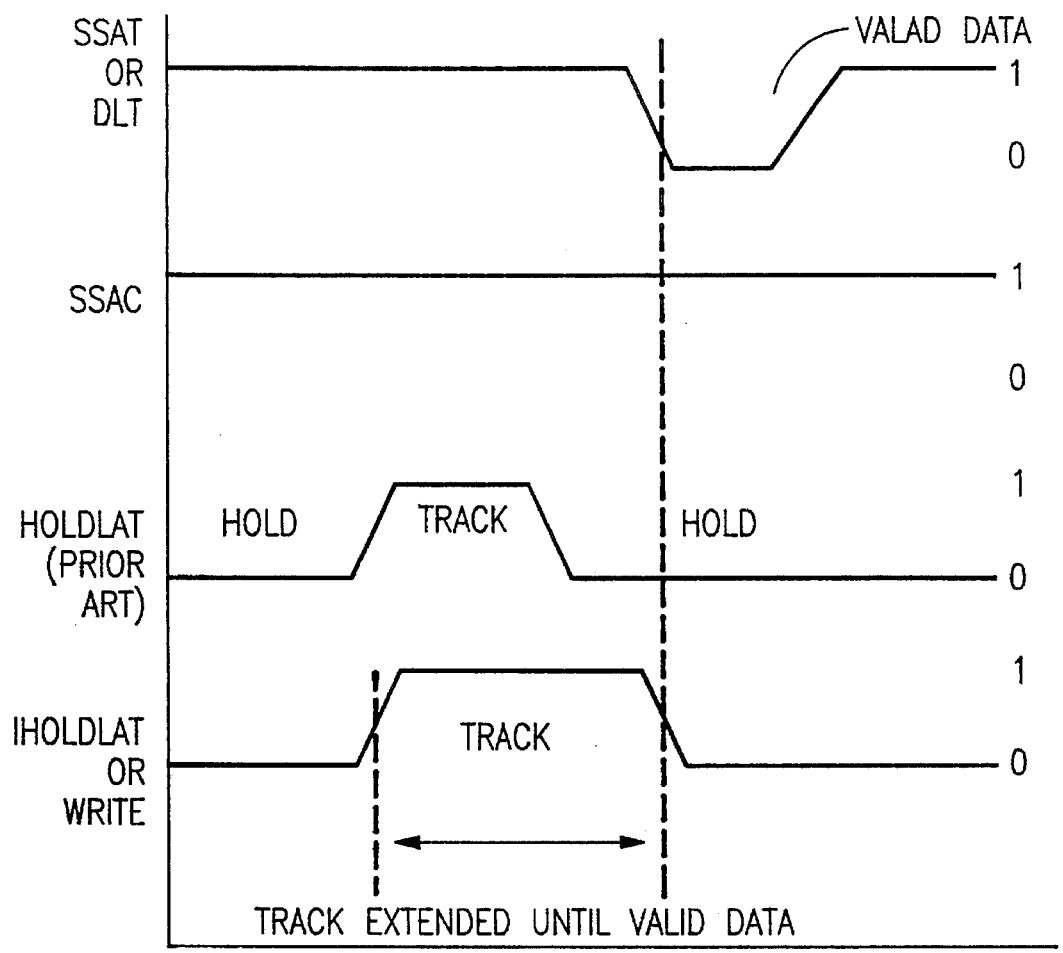
FIG. 6 is a signal waveform diagram illustrating the present invention read operation, showing valid data latched by the extended Hold Latch strobe.

FIG. 5 depicts the flow process of the preferred embodiment for assuring that valid data is latched in the Data-Out Hold Latch 8 and the Data-Write Buffer 7 turn-off is delayed until valid data is written in the Memory Array. FIG. 6 presents the waveforms for this embodiment which shows the extended time of the IHOLDLAT signal provided by the Complementary Interlock 13 as compared with the prior art HOLDLAT. By extending the IHOLDLAT signal until valid data appears on the complementary data lines SSAT and SSAC, latching of valid data is assured. The example in FIG. 6 shows latching of a memory cell data bit "0" (SSAT pulsed low and SSAC high) which triggers the trailing edge of IHOLDLAT. The rising edge of IHOLDLAT is triggered by the input HOLDLAT from Control Logic 9.

Figure 7:
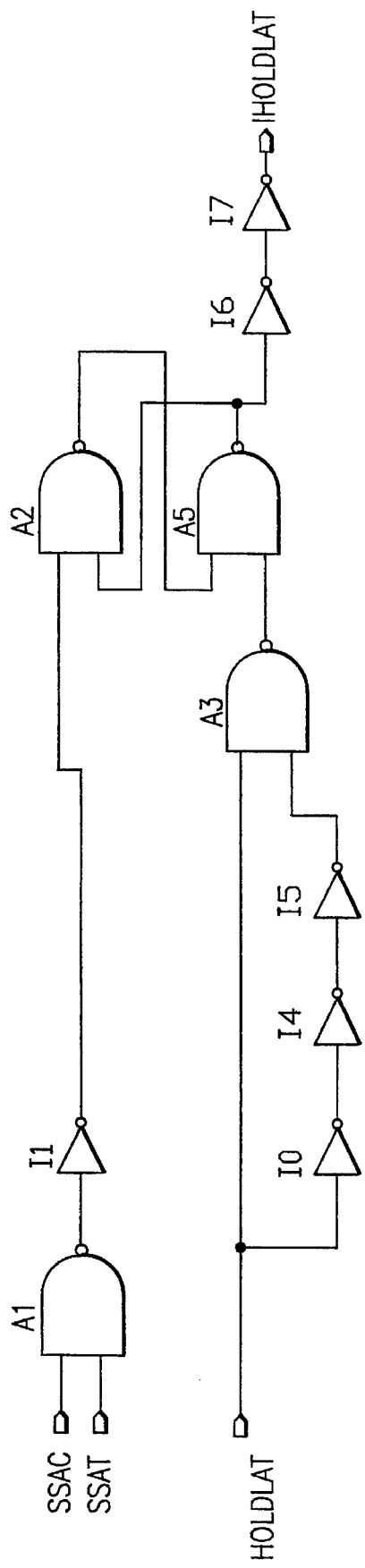
FIG. 7 shows details of the Complementary Interlock Read circuit.

Referring to FIG. 7 which shows the circuit included in Complementary Interlock 13, the Complementary Interlock (Read) makes use of the complementary nature of the SSAT and SSAC signals. A1 and I1 set the latch (A2 and A5). I0, I4, I5, and A3 constitute a single shot pulse generator which is used to reset the latch. The circuit takes as input signals HOLDLAT (enables circuit), SSAT and SSAC. The IHOLDLAT output signal is initialized to a low state (logical 0). When XCAS goes active HOLDLAT is generated, IHOLDLAT is driven to the track state and remains, until the SSAT and SSAC signals are driven to their valid state (valid data), hence the guarantee of latching valid data. The trailing edge of IHOLDLAT is triggered by the logical AND of SSAT and SSAC when valid data appears.

Figure 8:
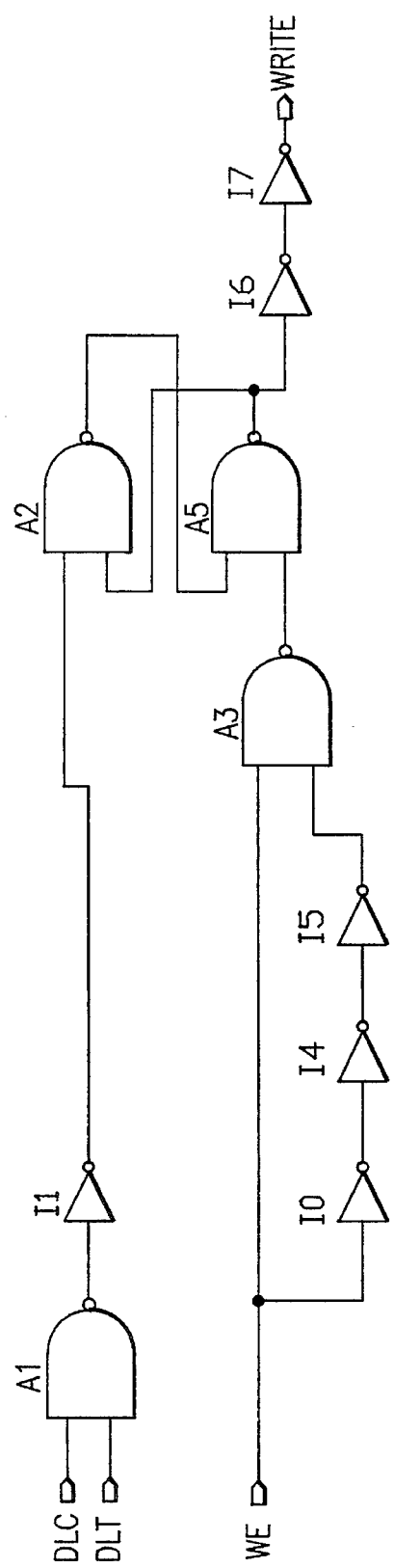
FIG. 8 shows details of the Complementary Interlock Write circuit.

Referring again to FIG. 4, the complementary nature of the signals DLT (Data Line True) and DLC (Data Line Compliment) is utilized by the Complementary Interlock (Write) block, FIG. 8, in the same fashion as that of the Complementary Interlock (Read) described above. In this case the Write Driver is held on until the DLT and DLC signals achieve their valid state (either signal drops low, detected by AND gate A1). The valid data is sent both to Sense Amp 3 and to the Complementary Interlock 14. As shown in FIG. 8, Interlock 14 output WRITE is first initialized low by signal WE which turns on the Write Driver, then receives valid data signals over DLT and DLC which triggers the Data-In Write Driver turn off (WRITE rising) and A2 and A7 latch the data, hence, valid data is guaranteed to be written into the Memory Array 2.

Those skilled in the art will note from the above description that a high performance latch technique has been presented, wherein a Complementary Interlock circuit is facilitated using the complementary nature of the signal to be latched. Thus high performance limitations of external timings to the DRAM are completely removed. The performance achieved is therefore limited by the internal performance of the device itself and is independent of the externally provided signals to the device.

Alternative Embodiments

Although a specific embodiment has been described and illustrated above it is not limited to such. It is capable of numerous rearrangements, modifications and substitutions without departing from the scope of the invention. For example, while the discussion referred to DRAM data processing, the invention is not limited to such. The technique can be implemented in any instance where complementary signals are available. In addition, the complementary nature can be imposed upon normally non-complementary signals, by simply creating the complement, i.e. through inversion.

We claim:

1. A data storage apparatus comprising:

a memory array including a plurality of data cells for storing digital data;

control logic for initiating a read operation via data signals including a row address strobe (RAS) and a column address strobe (CAS);

decoder means, coupled to the control logic and to the memory array, for decoding the CAS and the RAS and for accessing a data cell in the memory array addressed by the RAS and CAS;

reading means, coupled to the memory array, for retrieving data from the accessed data cell;

latch means, coupled to the reading means, for receiving the data retrieved from the data cell;

a complementary read interlock, coupled to the latch means and to the reading means, for providing a latching signal to the latch means, the latching signal based on the data retrieved from the data cell and enabling the latch means to receive the data retrieved from the data cell; and off-chip driver means for providing the data received in the latch means to hardware coupled to the data storage apparatus.

2. The apparatus according to claim 1, wherein the data retrieved by the reading means comprises complementary signals, and wherein the complementary read interlock includes means for monitoring the complementary signals and means for withholding the latching signal until the complementary signals indicate that the retrieved data can be received by the latch means.

3. The apparatus according to claim 2, wherein the complementary read interlock is coupled to the control logic and is activated by a signal from the control logic.

4. A data storage apparatus comprising:

a memory array including a plurality of data cells for storing digital data;

control logic for initiating a write operation via data signals including a write enable (WE), row address strobe (RAS), and a column address strobe (CAS);

decoder means, coupled to the control logic and to the memory array, for decoding the CAS and the RAS and for accessing a data cell in the memory array addressed by the RAS and CAS;

writing means, coupled to the memory array, for storing data into the accessed data cell;

latch means, coupled to the writing means, for providing to the writing means data to be stored into the accessed data cell;

a complementary write interlock, coupled to the writing means, for receiving from the writing means write signals indicating that the data to be stored in the accessed data cell has actually been stored, and for resetting the writing means upon receiving the write signals; and buffer means, coupled to the latch means, for holding data received from hardware coupled to the data storage apparatus to be stored in the accessed data cell, and for providing to the latch means the data to be stored in the accessed data cell.

5. The apparatus according to claim 4, wherein the complementary write interlock is coupled to the control logic and is activated by a signal from the control logic.

6. A data storage apparatus comprising:

a memory array including a plurality of data cells for storing digital data;

control logic for initiating a read operation via data signals including a row address strobe (RAS) and a column address strobe (CAS);

decoder means, coupled to the control logic and to the memory array, for decoding the CAS and the RAS and for accessing a data cell in the memory array addressed by the RAS and CAS;

reading means, coupled to the memory array, for retrieving data from the accessed data cell;

latch means, coupled to the reading means, for receiving the data retrieved from the data cell;

a complementary read interlock, coupled to the latch means and to the reading means, for providing a latching signal to the latch means, the latching signal based on the data retrieved from the data cell and enabling the latch means to receive the data retrieved from the data cell;

off-chip driver means for providing the data received in the latch means to hardware coupled to tile data storage apparatus;

the control logic including means for initiating a write operation via data signals including a write enable (WE), the row address strobe (RAS), and the column address strobe (CAS);

writing means, coupled to the memory array, for storing data into the accessed data cell;

data-in latch means, coupled to the writing means, for providing to the writing means data to be stored into the accessed data cell;

a complementary write interlock, coupled to the writing means, for receiving from the writing means write signals indicating that the data to be stored in the accessed data cell has actually been stored, and for resetting the writing means upon receiving the write signals; and buffer means, coupled to the data-in latch means, for holding data received from hardware coupled to the data storage apparatus to be stored in the accessed data cell, and for providing to the data-in latch means the data to be stored in the accessed data cell.

7. The apparatus according to claim 6, wherein the data retrieved by the reading means comprises complementary signals, and wherein the complementary read interlock includes means for monitoring the complementary signals and means for withholding the latching signal until the complementary signals indicate that the retrieved data can be received by the latch means.

8. The apparatus according to claim 7, wherein the complementary read interlock is coupled to the control logic and is activated by a signal from the control logic.

9. The apparatus according to claim 8, wherein the complementary write interlock is coupled to the control logic and is activated by a signal from the control logic.

* * * * *